United States Patent
Roebke

(10) Patent No.: US 9,572,281 B2
(45) Date of Patent: Feb. 14, 2017

(54) METHOD FOR CONTROLLING A MECHANICAL VIBRATING ELEMENT

(71) Applicant: Goodrich Lighting Systems GmbH, Lippstadt (DE)

(72) Inventor: Steffen Roebke, Paderborn (DE)

(73) Assignee: GOODRICH LIGHTING SYSTEMS GMBH (DE)

( * ) Notice: Subject to any disclaimer, the term of this patent is extended or adjusted under 35 U.S.C. 154(b) by 166 days.

(21) Appl. No.: 14/105,985

(22) Filed: Dec. 13, 2013

(65) Prior Publication Data
US 2014/0166260 A1   Jun. 19, 2014

(30) Foreign Application Priority Data

Dec. 13, 2012 (EP) .................................. 12197053

(51) Int. Cl.
*F04B 49/06* (2006.01)
*H05K 7/20* (2006.01)
*F04D 33/00* (2006.01)

(52) U.S. Cl.
CPC ......... *H05K 7/20209* (2013.01); *F04B 49/065* (2013.01); *F04D 33/00* (2013.01)

(58) Field of Classification Search
CPC ...... F04D 27/004; F04D 33/00; H05K 7/2029; F04B 17/003; F04B 43/046; F04B 43/095; F04B 49/06; F04B 49/065; B60Q 1/04
USPC ..................... 417/436, 44.11, 410.2, 45, 417
See application file for complete search history.

(56) References Cited

U.S. PATENT DOCUMENTS

| | | | | |
|---|---|---|---|---|
| 4,063,826 A | * | 12/1977 | Riepe ...................... | F04D 33/00 417/410.1 |
| 4,595,338 A | * | 6/1986 | Kolm ...................... | F04D 33/00 310/330 |
| 4,923,000 A | * | 5/1990 | Nelson .................... | F04D 33/00 165/122 |
| 5,008,582 A | * | 4/1991 | Tanuma ................ | H01L 23/467 257/E23.099 |
| 5,861,703 A | * | 1/1999 | Losinski ................. | F04D 33/00 257/E23.099 |

(Continued)

FOREIGN PATENT DOCUMENTS

WO    8002445 A1   11/1980

OTHER PUBLICATIONS

European Search Report dated May 6, 2013 for Application No. 12197053.7-1607, pp. 1-5.

*Primary Examiner* — Charles Freay
*Assistant Examiner* — Philip Stimpert
(74) *Attorney, Agent, or Firm* — Cantor Colburn LLP

(57) ABSTRACT

A method for controlling a mechanical vibrating element driven by a driving means includes operating the driving means at an operation frequency for stimulating the vibrating element to oscillate at this frequency. The method also includes adjusting the operation frequency of the driving means for stimulating the vibration element at different frequencies and of determining a respective energy consumption of the driving means depending on the frequency at which the vibrating element oscillates. The resonance frequency of the oscillation of the vibrating element is identified as the frequency at which the energy consumption of the driving means is lowest and the driving means for stimulating the vibrating element can be operated at the resonance frequency.

4 Claims, 4 Drawing Sheets

(56) References Cited

U.S. PATENT DOCUMENTS

| | | | | |
|---|---|---|---|---|
| 6,043,978 A * | 3/2000 | Mody | .................. | H01H 9/52 |
| | | | | 165/185 |
| 6,050,393 A * | 4/2000 | Murai | .................. | B06B 1/0261 |
| | | | | 198/533 |
| 7,061,161 B2 * | 6/2006 | Scher | .................. | H01L 41/0993 |
| | | | | 310/328 |
| 8,218,318 B2 * | 7/2012 | Aarts | .................. | F04F 7/00 |
| | | | | 165/122 |
| 8,291,750 B1 * | 10/2012 | Goodbread | .................. | G01N 11/16 |
| | | | | 73/54.41 |
| 2004/0005222 A1 * | 1/2004 | Yoshida | .................. | F04B 35/045 |
| | | | | 417/44.11 |
| 2005/0111987 A1 * | 5/2005 | Yoo | .................. | F04B 35/045 |
| | | | | 417/44.11 |
| 2006/0056979 A1 * | 3/2006 | Yoo | .................. | F04B 35/045 |
| | | | | 417/44.11 |
| 2006/0056980 A1 * | 3/2006 | Yoo | .................. | F04B 35/045 |
| | | | | 417/44.11 |
| 2007/0182286 A1 * | 8/2007 | Scher | .................. | H01L 41/0993 |
| | | | | 310/328 |
| 2009/0034197 A1 * | 2/2009 | Leija | .................. | H01L 23/467 |
| | | | | 361/703 |
| 2010/0047092 A1 * | 2/2010 | Erturk | .................. | F04D 33/00 |
| | | | | 417/410.2 |
| 2011/0068658 A1 * | 3/2011 | Kamitani | .................. | F04D 27/00 |
| | | | | 310/316.01 |
| 2012/0048522 A1 * | 3/2012 | Hessling | .................. | F21V 29/02 |
| | | | | 165/120 |
| 2012/0103094 A1 * | 5/2012 | Tustaniwskyj | .................. | G01M 7/022 |
| | | | | 73/514.29 |
| 2013/0064683 A1 * | 3/2013 | Oshima | .................. | F04B 23/04 |
| | | | | 417/44.1 |

* cited by examiner

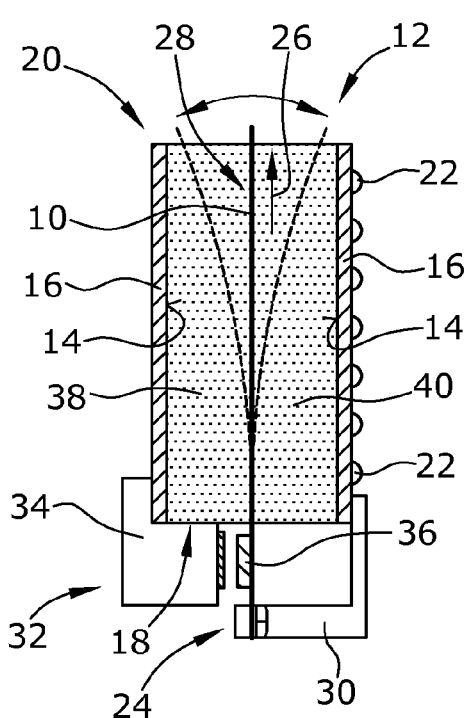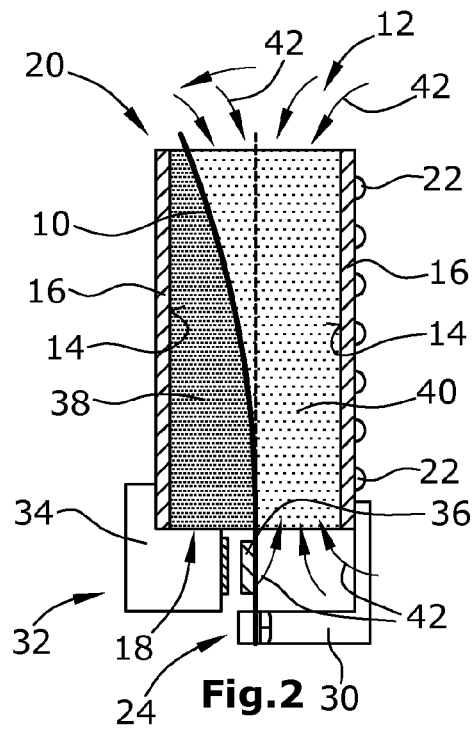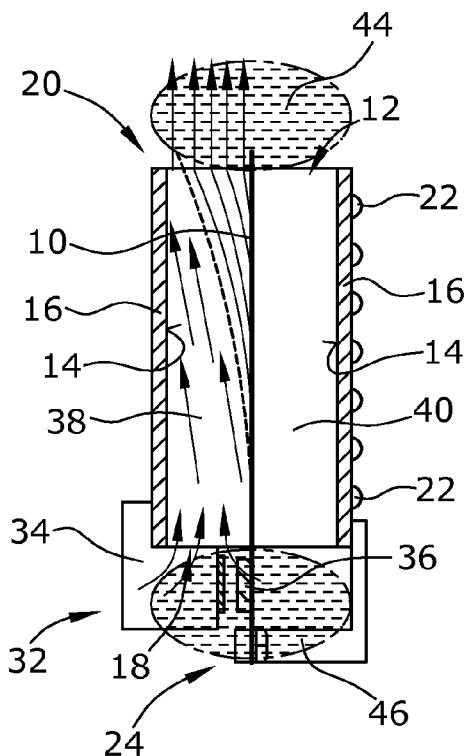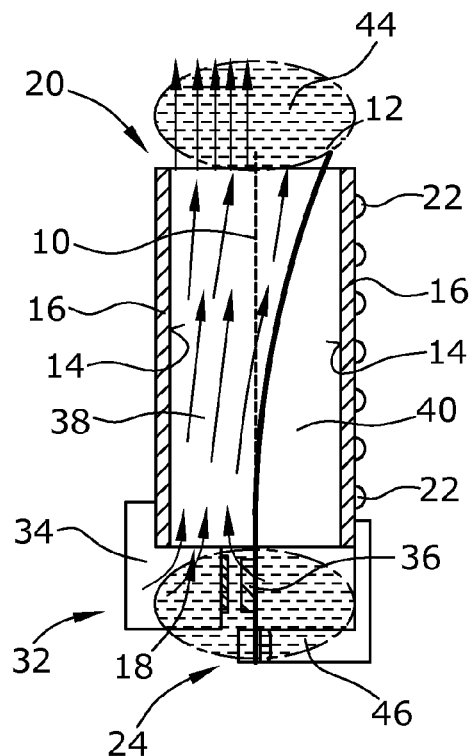

METHOD FOR CONTROLLING A MECHANICAL VIBRATING ELEMENT

RELATED APPLICATIONS

Priority under 35 U.S.C. §119(a) and 35 U.S.C. §365(b) is claimed from European Patent Application No. 12197053.7, filed 13 Dec. 2013, and all the benefits accruing therefrom under 35 U.S.C. §119, the contents of which in its entirety are herein incorporated by reference.

BACKGROUND OF THE INVENTION

The present disclosure relates to a method for controlling a mechanical vibrating element which is driven by a driving means operable at variable frequencies.

In diverse technical fields mechanical elements are operated so as to vibrate. The vibrating element typically is driven by a driving means which is coupled mechanically or in a different manner, e.g. electromagnetically to the vibrating element. In order to minimize the power consumption of the driving means it is advantageous to operate the driving means so that the vibrating element is stimulated to oscillate at its resonance frequency.

Due to diverse influences such as environmental influences it may happen that the mechanical properties of the vibrating element change, this means that also the resonance frequency of the vibrating element can change during lifetime and operation. Accordingly, there is a need in the prior art to take into consideration adjusting the resonance frequency at which a mechanical vibrating element is operated depending on varying mechanical properties of the vibrating element.

Accordingly, there is a need in the prior art to take into consideration adjusting the resonance frequency at which a mechanical vibrating element is operated depending on varying mechanical properties of the vibrating element.

BRIEF DESCRIPTION OF THE INVENTION

According to one embodiment, a method for controlling a mechanical vibrating element driven by a driving means includes: operating the driving means at an operation frequency for stimulating the vibrating element to oscillate at this frequency; adjusting the operation frequency of the driving means for stimulating the vibration element at different frequencies; determining a respective energy consumption of the driving means depending on the frequency at which the vibrating element oscillates; identifying a resonance frequency of the oscillation of the vibrating element at which resonance frequency the energy consumption of the driving means is lowest; and operating the driving means for stimulating the vibrating element at the resonance frequency.

In one embodiment, the energy consumption which depends on varying operation frequencies of the driving means, is determined. By this procedure, a wave form of the energy consumption depending on the operation frequency of the driving means can be obtained. Based on individual values of the energy consumption, that frequency can be determined and identified at which the power consumption is minimum. The operation frequency of the driving means with minimum power consumption is the resonance frequency or is at least close to the resonance frequency of the vibrating element.

Identifying the resonance frequency may comprise the step of identifying the frequency at which an electric current supplied to the driving means is minimum.

As explained above, prior to identifying the resonance frequency, in one embodiment, the driving means is operated at different operation frequencies. The frequency range used for adjusting the operation frequency of the driving means should include the expected resonance frequency of the vibrating element. Moreover, adjusting the operation frequency within this frequency range can be performed substantially continuously or in predetermined steps. Depending on the frequency step size and the tolerances of the power consumption measurement by means of the steps mentioned above, merely a relative inaccurate resonance frequency determination may be possible. Therefore, according to one aspect, the step of identifying the resonance frequency may include: stimulating the vibrating element by operating the driving means at the frequency at which the power consumption is lowest; deactivating the driving means; determining a waveform of the electric current or voltage induced into the driving means due to the vibrating element which is still fading out; and determining the resonance frequency as the frequency at which the vibrating element oscillates at a time prior to fading out.

In another embodiment the vibrating element induces electric current and/or voltage into the driving means due to the coupling of the vibrating element and the driving means. The driving means may be electromechanically coupled to the vibrating element. The resonance frequency of the vibrating element when the same is fading out after deactivation of the driving means can be determined based on the induced current and/or voltage in the driving means.

According to one embodiment, for providing optimal operation of the vibrating element at a minimum power consumption, identifying the resonance frequency is repeated from time to time i.e. in predetermined time intervals. As an alternative it is also possible that readjusting the operation frequency of the driving means for tracking the resonance frequency of the vibrating element is performed if (and when) the power consumption of the driving means changes by more than a predetermined threshold value.

Embodiments disclosed herein can be used, for example, in a cooling device for cooling an electric component such as an LED of an aircraft light, in that the vibrating element is an air ventilating blade which oscillates within a channel for generating an airflow. Such a cooling device may comprise: a channel extending between an inlet portion upstream of the air flow to be generated and an outlet portion downstream of the air flow to be generated wherein the channel comprises at least two substantially opposite side surfaces; a first bendable air ventilating blade arranged within the channel and having an overall longitudinal extension substantially coinciding with the extension of the channel, with a first longitudinal end upstream of the air ventilating blade flow to be generated and a second end arranged downstream of the air flow to be generated, wherein the first air ventilating blade has its first end fixedly arranged and has its second end reciprocatingly arranged; and driving means for reciprocating the second end of the air ventilating blade in a direction between the two substantially opposite side surfaces of the channel.

Accordingly, in one embodiment the cooling device comprises a channel extending between an inlet portion upstream of the airflow to be generated and an outlet portion downstream of the airflow to be generated. Such a channel for example can be defined between two adjacent cooling fins of a cooling element. The channel comprises at least two substantially opposite side surfaces which may be defined by two cooling fins. Between the two opposite side surfaces a first bendable air ventilating blade or sheet is arranged. The blade can be made from metal or plastics or other materials. In one embodiment, air ventilating blade has a longitudinal extension which substantially coincides with the extension of the channel. A first longitudinal end of the air ventilating blade is arranged upstream of the airflow and is fixedly arranged, while a second end of the air ventilating blade is arranged downstream of the airflow and is reciprocatingly arranged. Accordingly, the air ventilating blade at its second end can reciprocate, e.g. can vibrate or oscillate with the aid of a driving means. Basically the driving means can operate mechanically, electrically or electromagnetically. In the latter alternative for reciprocating the air ventilating blade no moving driving parts are necessary.

According to one embodiment, the operation of the device is based on the following physical concept. The air ventilating blade separates the channel into two chambers. When the reciprocatingly arranged second end of the air ventilating blade moves towards the first chamber, the air in this first chamber is compressed while the air in the second chamber is expanded. Accordingly, air from the surrounding is sucked into the second chamber. When thereafter the second end of the air ventilating blade is moved in the reverse direction, i.e. towards the second chamber, the air of the second chamber is pushed at high velocity creating low pressure at one end of the chamber so that air again is sucked towards the low pressure zone. This effect is supported by using an air flow in the direction of natural convection. Accordingly, the cooling device, in one embodiment, is arranged such that the channel extends vertically with the fixed first longitudinal end of the air ventilating blade arranged at a lower level than the reciprocating second end of the air ventilating blade. One or more channels can be provided wherein in each channel at least one air ventilating blade is arranged. All the air ventilating blades can be driven reciprocatingly by the driving means or by individual driving units.

According to another aspect, the at least one channel can be provided with several air ventilating blades which can be arranged side-by-side or can be arranged one behind the other in the direction of the extension of the channel. When arranged side-by-side, two adjacent air ventilating blades can be reciprocate inversely. In case that the air ventilating blades of a channel of the device are arranged one behind the other, the driving means can be adapted to reciprocate respectively adjacent air ventilation blades synchronously or inversely.

According to a further aspect, the cooling device may comprise several groups of air ventilating blades with each group comprising at least two air ventilating blades arranged side-by-side to each other and with the groups of air ventilating blades being arranged upstream or downstream of one another, wherein the driving means is adapted to inversely reciprocate, within each group, the air ventilating blades of a respective pair of adjacent air ventilating blades. In this embodiment, the driving means may be further adapted to reciprocate those air ventilating blades of all the groups which are arranged along the extension of the channel, respectively, in a synchronous manner or inversely.

Embodiments disclosed herein can be used in particular in a high performance aircraft light using high intensity LEDs such as an aircraft head lamp or an aircraft beacon or strobe light or in another type of anti-collision light. As mentioned above, the disclosed embodiments provide a way of how to provide a highly reliable forced cooling device for a heat dissipating electronic element. The cooling device is sufficiently robust to be mounted e.g. on a nose landing gear or on top of an aircraft. In electronic components and, in particular, in LEDs the performance and reliability over the lifetime both degrade due to increase in temperature. In LEDs it is particularly the junction temperature of the diode. Accordingly, it is necessary to cool the electronic component in order to operate it at maximum power, this is true in particular for LEDs. Heat can be transferred rapidly from the electronic component to heat sink fins depending on thermal conductivity of heat sink material such as copper, aluminum, heat pipes etc. However, heat transfer rates from the heat sink to the environment are rather slow due to natural convection. Therefore it is necessary to introduce forced convection. However, the problem with the currently available forced convection methods such as by using fans is that these devices, due to their moving mechanical parts, have very little lifetime compared to LEDs. Also the mechanical forced convection devices are unpopular due to undesirable noise. One or more embodiments may solve one or both of these issues. The lifetime issue can be overcome due to the mechanical stress on the oscillating air ventilating blade being kept below its fatigue endurance limit so that the lifetime basically is infinite. The problem of noise may be solved in that the frequency at which the air ventilating blade oscillates, is below the human audible range.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1 to 4 schematically illustrates the concept of how an air flow can be created in a channel by means of a oscillating air ventilating blade;

DETAILED DESCRIPTION OF THE INVENTION

Figure 5:
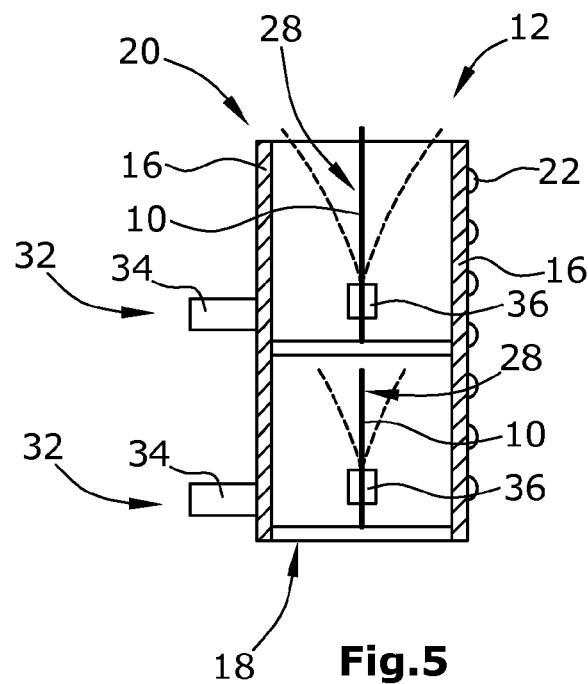
FIGS. 5 and 6 show two further embodiments of how several air ventilating blades can be arranged one behind the other or side-by-side within a channel.

The drawing figures are intended to illustrate the general manner of construction and are not necessarily to scale. In the detailed description and in the drawing figures specific illustrative examples are shown and herein described in detail. It should be understood, however, that the drawing figures and detailed description are not intended to limit the invention to the particular form disclosed, but are merely illustrative and intended to teach one of ordinary skill how to make and/or use the invention claimed herein.

Before embodiments of the present invention will be described in more detail, based on FIGS. 1 to 8 diverse embodiments of a cooling device will be explained in which the method of one embodiment of the present invention for observing a mechanical vibrating element can be used.

Based on FIGS. 1 to 4 an example of a principle of the present invention will be described in detail. In this embodiment for reciprocating an air ventilating blade, electromagnetic energy is used. However, other mechanisms for oscillating an air ventilating blade can be used according to the invention.

In the embodiment of FIGS. 1 to 4, an oscillation air ventilating blade 10 is arranged within a channel 12 limited by two substantially opposite side surfaces 14, e.g. formed as inner surfaces of two cooling fins of a heat sink (not shown in FIGS. 1 to 4) forming sidewalls 16 of the channel. The channel 12 can be closed at all of its lateral sides and extends between an inlet portion 18 and an outlet portion. As schematically shown in FIGS. 1 to 4, several LEDs 22 are mounted at one of the sidewalls 16 and can be cooled via this sidewall 16. Preferably the sidewalls 16 are made from heat conductive material. The air ventilating blade 10 has an overall longitudinal extension and is orientated and arranged within channel 12 such that both are extending substantially in 10 the same direction. The air ventilating blade 10 has a first longitudinal end 24 arranged upstream of an airflow (see arrow 26) to be generated. Moreover, the air ventilating blade 10 is provided with a second longitudinal end 28 arranged downstream of the airflow to be generated. At its first end 24, the air ventilating blade 10 is fixed at a support or holding element 30.

The air ventilating blade 10 can be made of any suitable material which is bendable, resilient and/or elastic. A preferred material may be metal. However, also plastics can be used for the air ventilating blade 10.

Moreover, the device according to FIGS. 1 to 4 is also provided with a drive means 32 which, in this embodiment, is provided with an electrically controlled solenoid 34 generating the periodically chancing magnetic field for reciprocating the air ventilating blade at its second end 28. The air ventilating blade 10, in this embodiment, is provided with a permanent magnet 36 which is arranged close to the first fixed longitudinal end 24 of the air ventilating blade 10. If the material, from which the air ventilating blade 10 is made, has permanent magnetic properties, providing a separate additional permanent magnet 36 might not be necessary. However, providing a permanent magnet 36 is advantageous in that an optimum push-pull-effect on the air ventilating blade 10 can be generated at low electrical power.

Mechanical stress on the air ventilating blade 10 should be kept as little as possible so that the air ventilating blade 10 oscillates and reciprocates below its fatigue endurance limit to get substantially infinite lifetime. Also the air ventilating blade 10 should reciprocate at its resonance frequency to minimize power requirement. The strengths of the permanent magnet 36 and the solenoid 34 both define the amplitude of the oscillating second end 28 of the air vibrating blade 10. Higher amplitudes generate higher air flows and, accordingly, higher cooling rates. Elastic properties of the air ventilating blade 10 are utilized for its oscillation so that wear and tear of the cooling parts is eliminated.

In order to further support the generation of an airflow in the direction of arrow 26, the channel 12 extends in the direction of natural convection, i.e. is orientated substantial vertically. The air ventilating blade 10 separates the volume defined by the channel 12 into two chambers, namely into a first chamber 38 and a second chamber 40. When the reciprocating second end 28 of the air ventilating blade 10 moves from its neutral position towards the first chamber 38, most of the air in the first chamber 38 is compressed and moves in any direction while at the same time the air in the second chamber 40 expands and, accordingly, sucks in air from the surroundings. This is shown in FIG. 2 by arrows 42. When the air ventilating blade 10 turns back (see FIG. 3), the expanded air in the second chamber 40 slides along with the air ventilating blade 10 and is pushed upwards towards and beyond the second end 28 of the air ventilating blade 10 at high velocity which creates a low pressure zone 44 at the outlet portion 20 of the channel 12. Therefore, the compressed air in 25 the first chamber 38 also streams upwards towards the low pressure zone 44. Compared to the low pressure zone 44 at the outlet portion of the channel 12, the channel 12 at its inlet portion 18 is surrounded by a relatively high pressure zone 46. Due to this pressure zone 46, air flows into the first chamber 38.

After having passed its neutral position, the air ventilation blade 10 moves towards the second chamber 40 and the air in the second chamber 40 is compressed. Accordingly, the same physical process as described before for the first chamber 38 now starts in the second chamber 40. When the cycle repeats, the velocity of the air that is pushed upwards does not allow air to move downwards when air is sucked in from the surroundings during air expansion due to the air ventilating blade 10 moving away from the sidewalls 16. Accordingly, air is merely sucked in from the lower side of the channel 12, i.e. from the inlet portion 18, and is pushed upwards towards and out of the outlet portion 20 of the channel 12.

Figure 6:
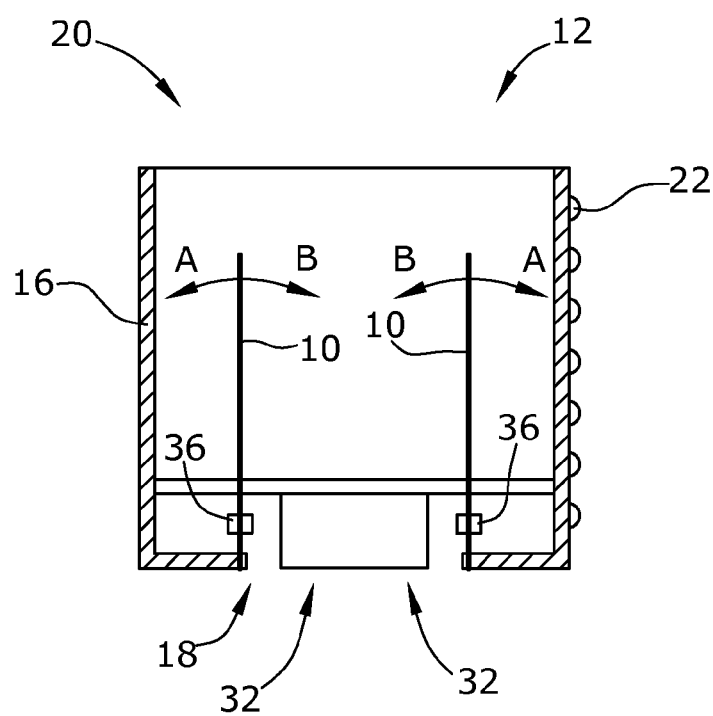

In FIGS. 5 and 6 two additional alternative embodiments are schematically shown wherein alike parts of the devices shown in FIGS. 1 to 6 are designated with like reference numerals, respectively.

In the embodiment according to FIG. 5, within the channel 12 there are arranged two air ventilating blades 10 which blades are arranged one behind the other. The drive means 32, due to magnetic influences, drive two air ventilating blades 10 so that they reciprocate at their respective second ends 28. The reciprocation movement of the two air ventilating blades 10 can be synchronous or inverse.

In FIG. 6, within the channel 12 there are arranged again two air ventilating blades 10 which are arranged side-by-side. The drive means 32 causes the two air ventilating blades 10 to reciprocate inversely. This is shown in FIG. 6 by the arrows A and B.

Figure 7:
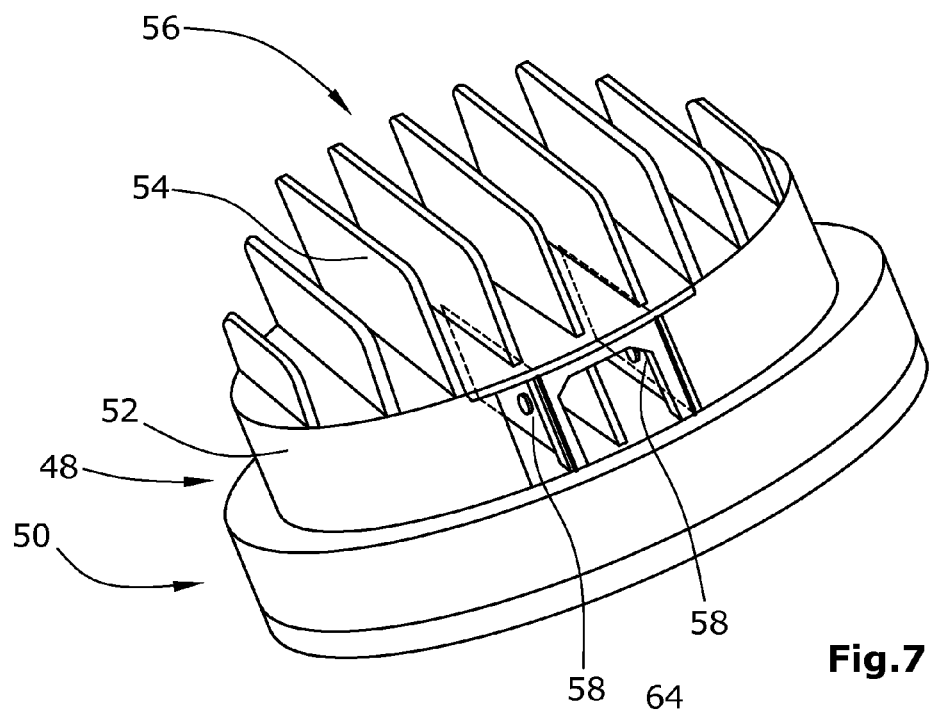
FIG. 7 shows a perspective view of a heat sink of an aircraft head light with LEDs (high performance LEDs) cooled by the heat sink which is provided in the device for generating an active airflow between adjacent heat sink fins.

In FIG. 7 the heat sink 48 of an aircraft light 50 is shown. The sink 48 comprises the cooling body 52 having several cooling fins 54. Between adjacent cooling fins 54, channels 56 are formed wherein air ventilating blades 58 are located within two adjacent channels. In this embodiment, the air ventilating blades 58 are arranged in alignment with the cooling fins 54 which have respective cut-out portions for accommodating the air ventilating blades 58.

Figure 8:
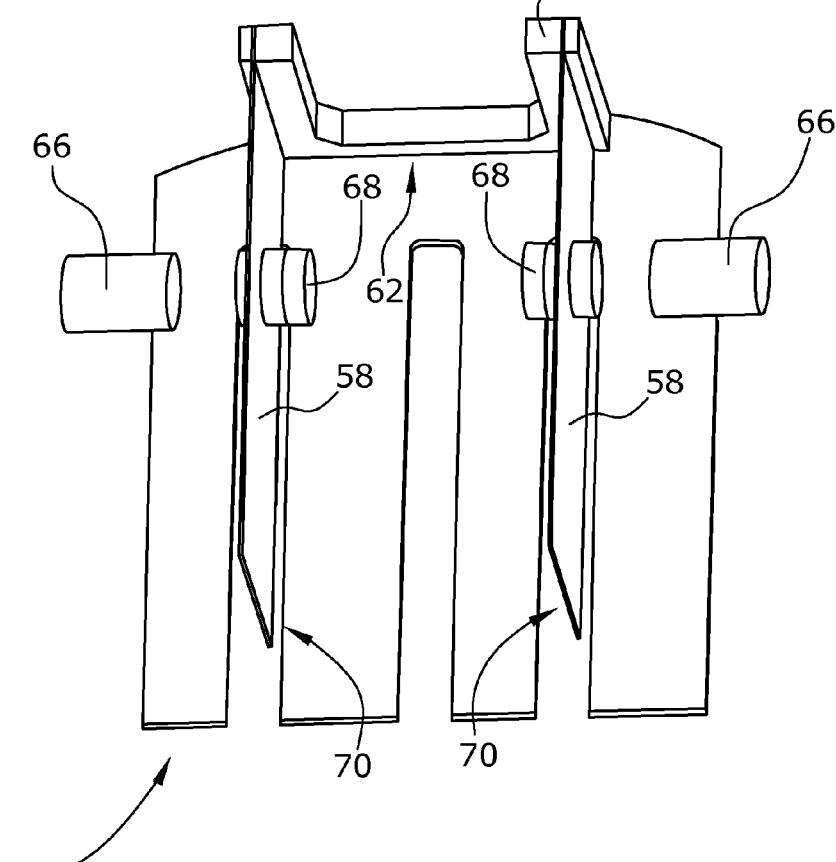
FIG. 8 shows a component of the heat sink according to FIG. 7 wherein the component is provided with two air ventilation blades arranged in adjacent channels between the heat sink fins.

FIG. 8 shows a mounting element 60 carrying the two air ventilating blades 58 fixedly mounted at their respective first ends 62 by means of a bracket 64. Reference numerals 66 designate drive means which, in this embodiment, again are formed as solenoids for magnetically coupling with permanent magnets 68 at the air ventilating blades 58. The air ventilating blades 58 again can oscillate and reciprocate at their second ends 70 as described before.

As described above, an air ventilating blade can be used for cooling of components. In order to minimize the power consumption of the driving means, the air ventilating blade should be stimulated at its resonance frequency to achieve maximum amplitude and maximum cooling performance. However, in particular when arranged exposed to the environment, the resonance frequency of an air ventilating blade can vary under diverse influences such as temperature variations, rain, dirt, or the like debris which can achieve the air ventilating blade.

Accordingly, it is advantageous to track the resonance frequency of the air ventilating blade. In order to determine the resonance frequency of the air ventilating blade there are different approaches which can be used alone or in combination.

1) The air ventilating blade is stimulated at a frequency which varies within a frequency range which encompasses the expected resonance frequency of the air ventilating blade. Within this frequency range, the current through the solenoid 34, i.e. in the driving means 32 can be measured and accordingly, the frequency at minimum current can be identified. This frequency is identical with or is at least close to the resonance frequency of the air ventilating blade 10. Depending on the frequency step size and tolerances of this current 30 measurement merely a relative inaccurate resonance frequency measurement may be possible by the procedure mentioned before. Therefore, in such a case, the exact resonance frequency or at least a more accurate resonance frequency can be determined by the following step 2.

2) The solenoid 34 is stimulated with the frequency determined in step 1 and, thereafter, is turned off. Directly thereafter, the voltage and/or current induced into the solenoid 34 due to the still oscillating air ventilating blade 10 can be measured and the resonance frequency can be obtained based on the wave forms of the voltage and/or current. The frequency determination according to step 1 appears to be necessary because otherwise no sufficient amplitude for measuring can be obtained. For the frequency measurements, for measurement controlling and for controlling the one or more solenoids 34, a small microcontroller can be used. The microcontroller can be operated with high-precision timing and can easily generate the relatively low frequencies for the solenoids.

Figure 9:
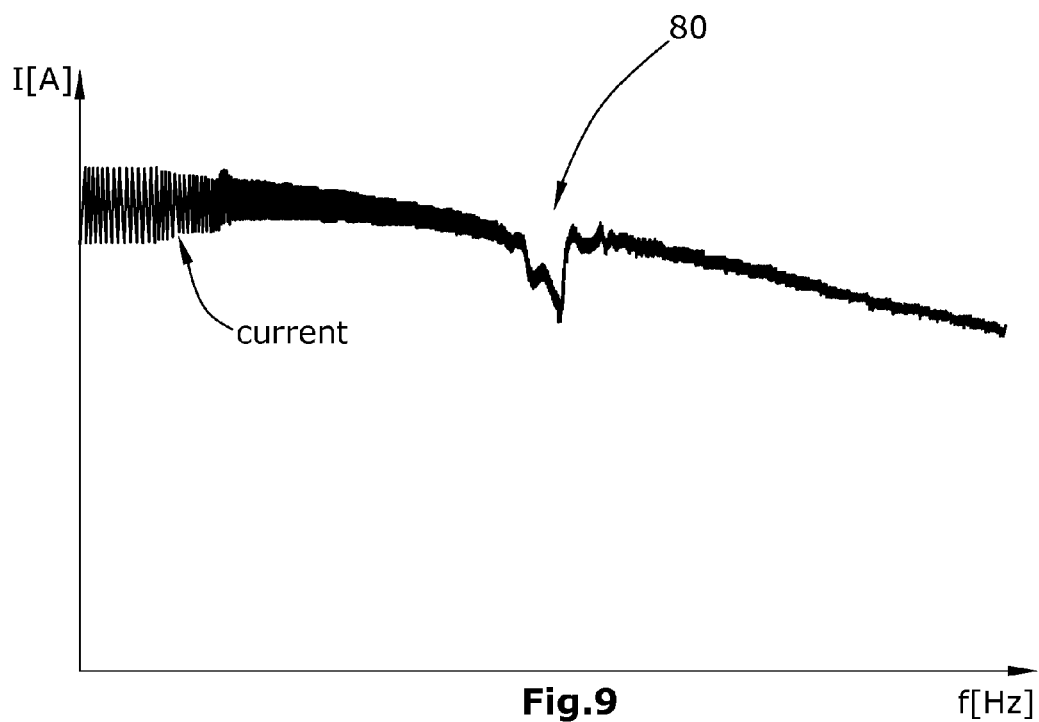
FIG. 9 shows a wave form of the dependency of the supply current to the driving means depending on the operation frequency of the driving means.
Figure 10:
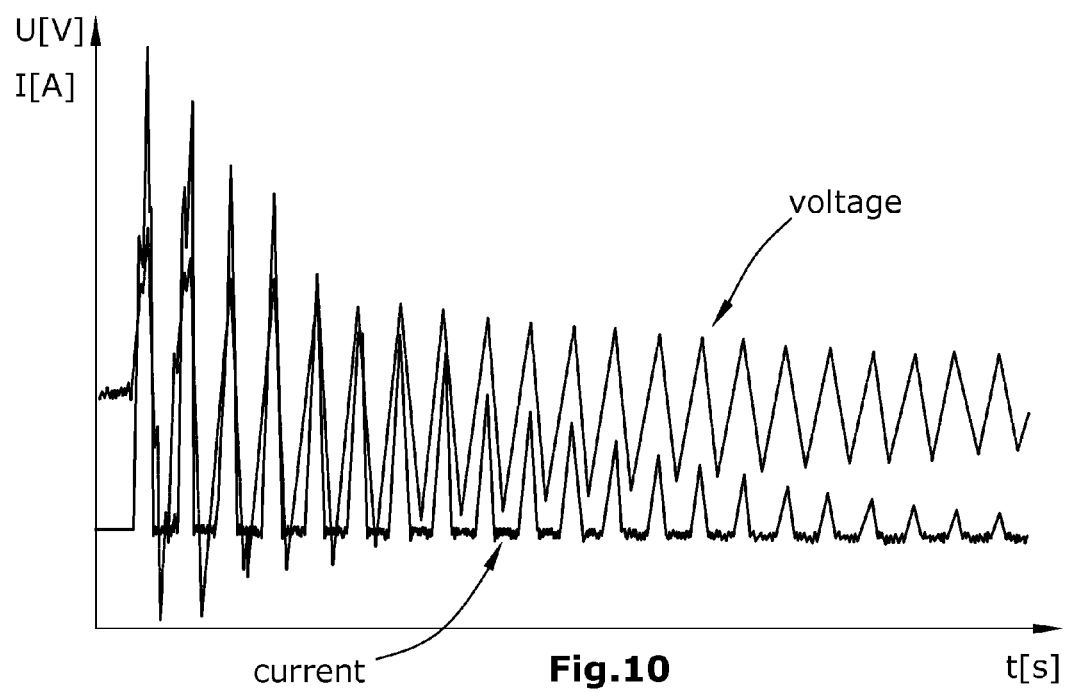
FIG. 10 shows wave forms of the induced current and voltage of the driving means during the fading out of the air ventilating blade after the driving means has been deactivated.

There are different possible implementations for using the method according to the invention in order to identify and trace the resonance frequency of the air ventilating blade 10:

1) Determination of the resonance frequency only by measuring the current peaks. FIG. 9 shows the dependency of the current on the operation frequency. The current peak 80 clearly identifies (at least roughly) the resonance frequency of the air ventilating blade 10.

2) Determination of the resonance frequency by measuring the current peak, stimulating the air ventilating blade 10 at this resonance frequency, and final measurement of the natural frequency (i.e. eigen frequency). The latter can be performed based on the wave forms of the voltage and/or current induced into the solenoids due to the still oscillating air ventilating blade 10 fading out after the activation of the solenoid. Namely the frequency of the induced voltage and/or current into the solenoids after termination of the stimulation of the air ventilating blade 10 is the resonance frequency.

3) Measurement of the resonance frequency by means of Hall sensors or sensorless by current and/or voltage measurements.

4) Stimulation of the air ventilating blade 10 with one or more (e.g. opposite electromagnetic magnets.

5) For controlling the electromagnets, a full driver bridge controlled by a microcontroller can be used.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method of controlling an air ventilating blade driven by a driving means in a cooling device of an aircraft light, with the air ventilating blade being arranged in a cooling channel between cooling fins of the aircraft light and with an oscillating of the air ventilating blade generating an airflow for cooling an LED of the aircraft light, the method comprising:

operating the driving means at an operation frequency to stimulate the air ventilating blade, with the air ventilating blade oscillating in the cooling channel of the cooling device of the aircraft light at the operating frequency;

adjusting the operation frequency of the driving means to stimulate the air ventilating blade at different frequencies, wherein the step of adjusting the operation frequency of the driving means comprises adjusting the operation frequency in a stepwise manner;

determining a respective energy consumption of the driving means depending on the frequency at which the air ventilating blade oscillates;

identifying an approximate resonance frequency of the oscillation of the air ventilating blade as the frequency at which the energy consumption of the driving means is lowest while the air ventilating blade is being stimulated;

performing a first stimulation of the air ventilating blade by operating the driving means at the approximate resonance frequency, with the air ventilating blade oscillating in the cooling channel of the cooling device of the aircraft light at the approximate resonance frequency;

deactivating the driving means;

determining a waveform of an electric current or a voltage induced into the driving means after the deactivating of the driving means and before the oscillating of the air ventilating blade terminates;

determining a resonance frequency of the oscillation of the air ventilating blade as the frequency at which the air ventilating blade oscillates after the deactivating of the driving means and before the oscillating of the air ventilating blade terminates; and performing a second stimulation of the air ventilating blade by operating the driving means at the resonance frequency, with the air ventilating blade oscillating in the cooling channel of the cooling device of the aircraft light at the resonance frequency.

2. The method according to claim 1, wherein the step of identifying the approximate resonance frequency comprises identifying the frequency at which an electric current supplied to the driving means is lowest.

3. The method according to claim 1, wherein the driving means is electromagnetically coupled to the air ventilating blade.

4. The method according to claim 1, wherein during oscillation of the vibrating element readjusting the operation frequency of the driving means for identifying the resonance frequency of the air ventilating blade is performed in predetermined time intervals or is performed if the power consumption changes by more than a predetermined threshold value.

* * * * *